(12) United States Patent
Smith

(10) Patent No.: US 7,278,077 B1
(45) Date of Patent: Oct. 2, 2007

(54) IBIST TEST FOR SYNCHRONOUS LINES AT MULTIPLE FREQUENCIES

(75) Inventor: Brian L. Smith, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 411 days.

(21) Appl. No.: 10/689,265

(22) Filed: Oct. 20, 2003

(51) Int. Cl.
*G01R 31/28* (2006.01)
(52) U.S. Cl. ........................................ 714/733
(58) Field of Classification Search ............ None
See application file for complete search history.

(56) References Cited

U.S. PATENT DOCUMENTS

| | | | | |
|---|---|---|---|---|
| 5,029,166 A | * | 7/1991 | Jarwala et al. | 714/724 |
| 5,173,906 A | * | 12/1992 | Dreibelbis et al. | 714/733 |
| 5,621,741 A | * | 4/1997 | Kohiyama | 714/744 |
| 5,764,655 A | * | 6/1998 | Kirihata et al. | 714/733 |
| 5,898,703 A | * | 4/1999 | Lin | 714/726 |
| 6,076,177 A | * | 6/2000 | Fontenot et al. | 714/724 |
| 6,201,829 B1 | * | 3/2001 | Schneider | 375/221 |
| 6,467,056 B1 | * | 10/2002 | Satou et al. | 714/720 |
| 6,480,979 B1 | * | 11/2002 | Tomari | 714/724 |
| 6,684,350 B1 | * | 1/2004 | Theodoras et al. | 714/712 |
| 6,697,979 B1 | * | 2/2004 | Vorbach et al. | 714/724 |
| 6,760,865 B2 | * | 7/2004 | Ledford et al. | 714/30 |
| 6,950,972 B2 | * | 9/2005 | Liu et al. | 714/714 |
| 2002/0138802 A1 | * | 9/2002 | Firth et al. | 714/733 |

* cited by examiner

*Primary Examiner*—Cynthia Britt
*Assistant Examiner*—Steven D. Radosevich
(74) *Attorney, Agent, or Firm*—Meyertons Hood Kivlin Kowert & Goetzel, P.C.; Rory D. Rankin (57) ABSTRACT

A system for testing a synchronous link utilizing a single test pattern sequence. Components coupled via a link are each configured to generate and check test patterns according to a single repeated test pattern sequence. Test patterns which are generated are based upon two simple patterns. Each test cycle, a bit is chosen from one of the two patterns for use in generating the test pattern. A sixteen cycle test pattern sequence is utilized in which values are chosen from one or the other of the two patterns in a predetermined manner. In a bi-directional test, two components which are coupled via a link alternate driving selected values based upon the predetermined sequence. Each component may alternate driving sequences of one or more cycles. An ordering of cycles may be chosen to test various permutations of driver interaction between the respective components.

19 Claims, 9 Drawing Sheets

IBIST TEST FOR SYNCHRONOUS LINES AT MULTIPLE FREQUENCIES

BACKGROUND OF THE INVENTION

1. Field of the Invention

This invention is related to the field of computer systems and, more particularly, to verifying synchronous links within computer systems.

2. Description of the Related Art

Integrated circuits (or "chips") have included built-in self test (BIST) circuitry in order to ensure that the internal circuits of the chips are functioning properly. Generally, the BIST applies a series of test vectors to the inputs of the internal circuits and compares the outputs of the internal circuits to expected results. If the outputs differ from the expected results, then the BIST fails and the chip may include a faulty internal circuit. is BIST may be run on the chip at the time of manufacture of the integrated circuit to screen out faulty parts before delivery to a customer, and may be run when the system including the chip is powered up (or at some other time as may be desired) to ensure that the chip is still functioning properly. The interconnect between chips has typically been synchronous, and has typically not been tested using any type of BIST. In a synchronous interconnect, a single system clock is used by each of the chips connected to the synchronous interconnect to time the driving of signals on the interconnect and the sampling of signals from the interconnect. Each chip is designed to meet certain timing criteria with respect to the clock signal (e.g. setup and hold times), and these timing criteria may be tested for each chip when that chip is manufactured. However, once the chips are assembled into a system, the testing of the interconnect is typically limited to in-circuit testing (ICT) or boundary scan testing (e.g. the type of tests specified by IEEE 1149 and 1149.1). ICT and boundary scan testing is typically performed at low clock frequencies, generally significantly lower than the operating frequency of the interconnect (i.e. the frequency at which the interconnect operates when the system is running). Accordingly, ICT and/or boundary scan testing may detect faults such as broken connections in the interconnect but may be severely limited in detecting timing-related failures.

Generally, systems utilizing IBIST as described above include additional circuitry to generate test patterns and check test patterns. Because of the ever shrinking nature of modern electronics, it is desired that any additional circuitry be as efficient as possible.

SUMMARY OF THE INVENTION

The problems outlined above are in large part solved by a system as described herein. The system may perform interconnect BIST (IBIST) testing on synchronous links. More particularly, the system may perform, at normal operating frequency for the synchronous link, a synchronous link test that utilizes a specially chosen test pattern that enables the minimization of additional circuitry while still performing comprehensive testing.

In one embodiment, a system for testing a synchronous link utilizing a single test pattern sequence is contemplated. Two components may be coupled to one another via a link. Each of the components may include circuitry which is configured to generate and check test patterns according to a single repeated test pattern sequence. In one embodiment, a sixteen cycle test pattern sequence is utilized in which values are chosen from one or the other of two state registers. Each test cycle, a bit is chosen from one of the two registers for use in generating the test pattern. In one embodiment, multiple link lines may be configured for testing in such a manner. Link lines may each be coupled to separate state registers, or may be coupled to share particular state registers as deemed appropriate. In a bi-directional test, each of the components alternate driving two value sequences. In one embodiment, an ordering of the two sequence cycles may be chosen to test various permutations of driver interaction between the respective components. Further, the two value sequences themselves may be chosen to cover each two value permutation.

BRIEF DESCRIPTION OF THE DRAWINGS

Other objects and advantages of the invention will become apparent upon reading the following detailed description and upon reference to the accompanying drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Figure 1:
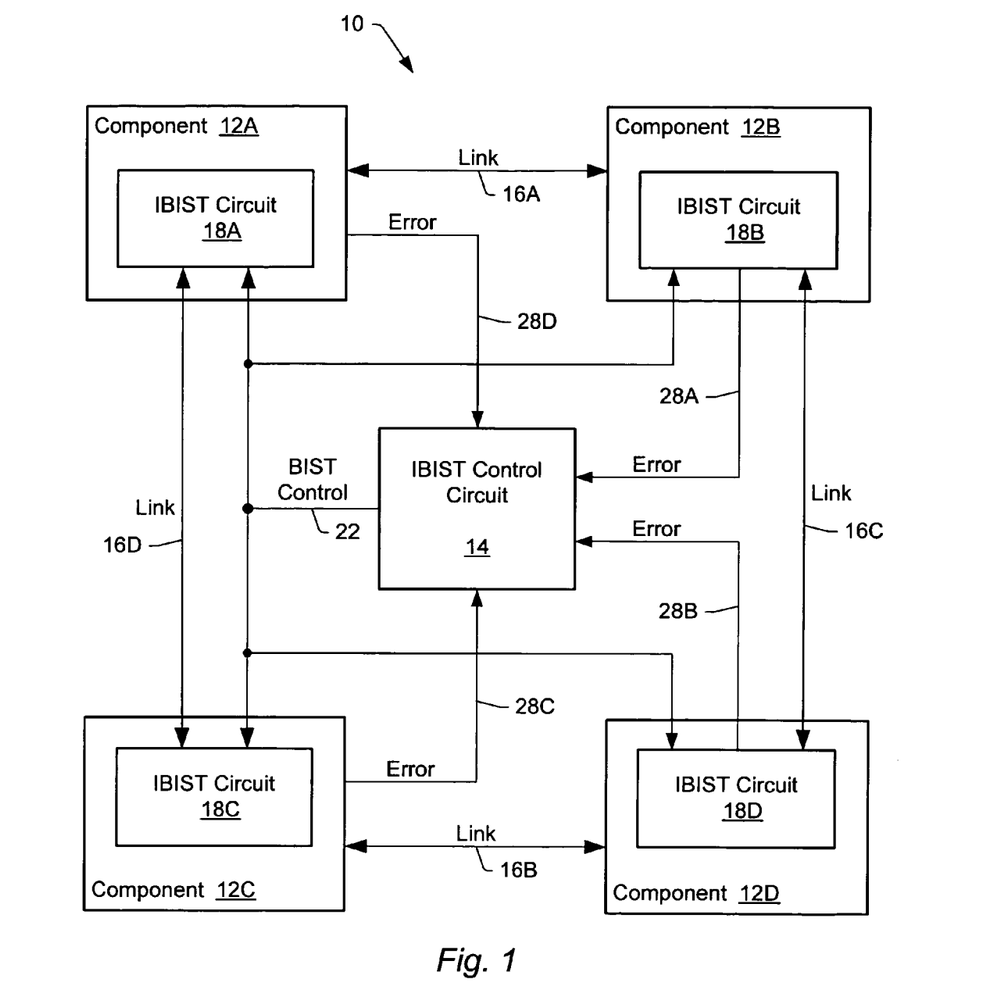
FIG. 1 is a block diagram of one embodiment of a computer system.

Turning now to FIG. 1, a block diagram of an exemplary system 10 is shown. Other embodiments are possible and contemplated. In the embodiment shown in FIG. 1, system 10 includes a plurality of components 12A-12D and an interconnect BIST (IBIST) control circuit 14. Component 12A is coupled to component 12B via a synchronous link 16A, and to component 12C via a synchronous link 16D. Component 12D is coupled to component 12B via a synchronous link 16C, and to component 12C via a synchronous link 16B. Each of components 12 are further configured with IBIST circuitry 18A-18D configured to generate and/or check test patterns. Elements referred to herein with a particular reference number followed by a letter will be collectively referred to by the reference number alone. For example, components 12A-12D will be collectively referred to as components 12.

In one embodiment, IBIST control circuit 14 is coupled to provide BIST control signals on lines 22 to each of circuits 18A-18D. In response to control signals received from control circuit 14, one or more of IBIST circuits 18 may be configured to initiate testing. IBIST control circuit 14 is further coupled to receive error indications on lines 28A-28D from IBIST circuits 18.

Links 16A-16D may each be a synchronous link including one or more data lines which may be differential or not differential, as desired.

To initiate IBIST, IBIST control circuit 14 uses the BIST control signals to control IBIST circuits 18A-18D. For example, the BIST control signals 22 may include a "run IBIST" signal that activates each of circuits 18A-18D to perform synchronous link testing. Additional control signals may be included as desired. In an alternative embodiment, circuits 18 may be coupled to receive an IBIST setup and/or startup command issued by a service processor via a common bus. For example, to initiate testing, a service processor may perform a write to start registers included within circuits 18. In an embodiment where such writes may be received by the circuits 18 with varying latencies, and it is desired that the writes be performed in a generally concurrent manner, the service processor may be configured to perform such writes in such a manner that the selected registers within circuits 18 are all written within a predetermined window of time.

The testing of synchronous links 16 may be described as follows. As used herein, a data transfer is a communication of a data bit on each line of the link. In one embodiment, data is transferred on each edge of the clock signal on the link, and thus two data transfers occur per clock period. Other embodiments may transfer one data bit per clock period or more than two data bits per clock period. A transition is a change from one data state on a line to the other data state on the line (e.g. from a logical high ("1"), to a logical low ("0") or from a logical low to a logical high).

During IBIST, IBIST control circuit 14 may cause link test patterns to be generated, conveyed, and/or checked. A link test pattern includes one or more link test vectors. Each link test vector specifies a value for each bit on, for example, link 16A to be transmitted during a particular data transfer on link 16A. A series of link test vectors are transmitted during consecutive data transfers on the link (at normal link operating frequency). For example, IBIST circuit 18A may cause component 12B to transmit link test vectors to component 12A via link 16A, and vice-versa. IBIST circuit 18B may be configured to expect the corresponding value for each bit (i.e., the check vector) on link 16A and check the received link test vectors against the expected values. If a received bit from link 16A does not match a corresponding bit from the check vector, then IBIST circuit 18B indicates an error to IBIST control circuit 14 via the error indication 28A. Alternatively, circuit 18B may indicate an error by updating a local status register which is then subsequently accessed by control circuit 14, a service processor, or some other circuitry. In addition to indicating an error has occurred, such a status register may also include information such as the test pattern which failed, the link associated with the error, and any other information which may be useful in a subsequent debug and analysis of the failure. The error indication 28A may include a signal that an error has occurred, along with an identification of the line on the link on which the failure was detected. In one particular embodiment, the error indication may further include an indication of which of the test vectors transmitted during the clock period in which the failure was detected and on which data line the failure was detected. IBIST control circuit 14 records the error for reference by software at the conclusion of the test.

Each of components 12A-12D may perform a function within system 10, and may interact with other components 12A-12D to provide the operation defined for system 10. For example, each component may be a chip incorporating certain functionality and capable of communicating with other chips. The chip may be a processor (or group of processors), a peripheral interface chip, etc.

It is noted that, while four links 16A-16D are shown, IBIST control circuit 14 may be configured to control IBIST on any number of links. Additionally, IBIST control circuit 14 may be distributed to the IBIST circuits 18 and 12, as desired. Still further, while FIG. 1 illustrates a component as being both a transmitter and receiver on a link, components may alternatively be either transmitters or receivers on various links within the system. The number of links coupled to a given component may vary from component to component.

It is noted that the synchronous link testing as described herein may be used in a variety of ways. For example, the synchronous link testing may be used to test system 10 prior to shipment to a customer. Additionally, the synchronous link test may be used to test system 10 during use. For example, when a new component is inserted into system 10, synchronous link testing may be used to determine that the new component is communicating properly with other components. Additionally, synchronous link testing may be used for diagnostic or maintenance purposes during use. For example, by running synchronous link testing with the supply voltages at the high and low limits of the permissible range (typically 5-10% above and below the nominal voltage), the links may be characterized and failing hardware may be predicted prior to an actual failure.

Figure 2:
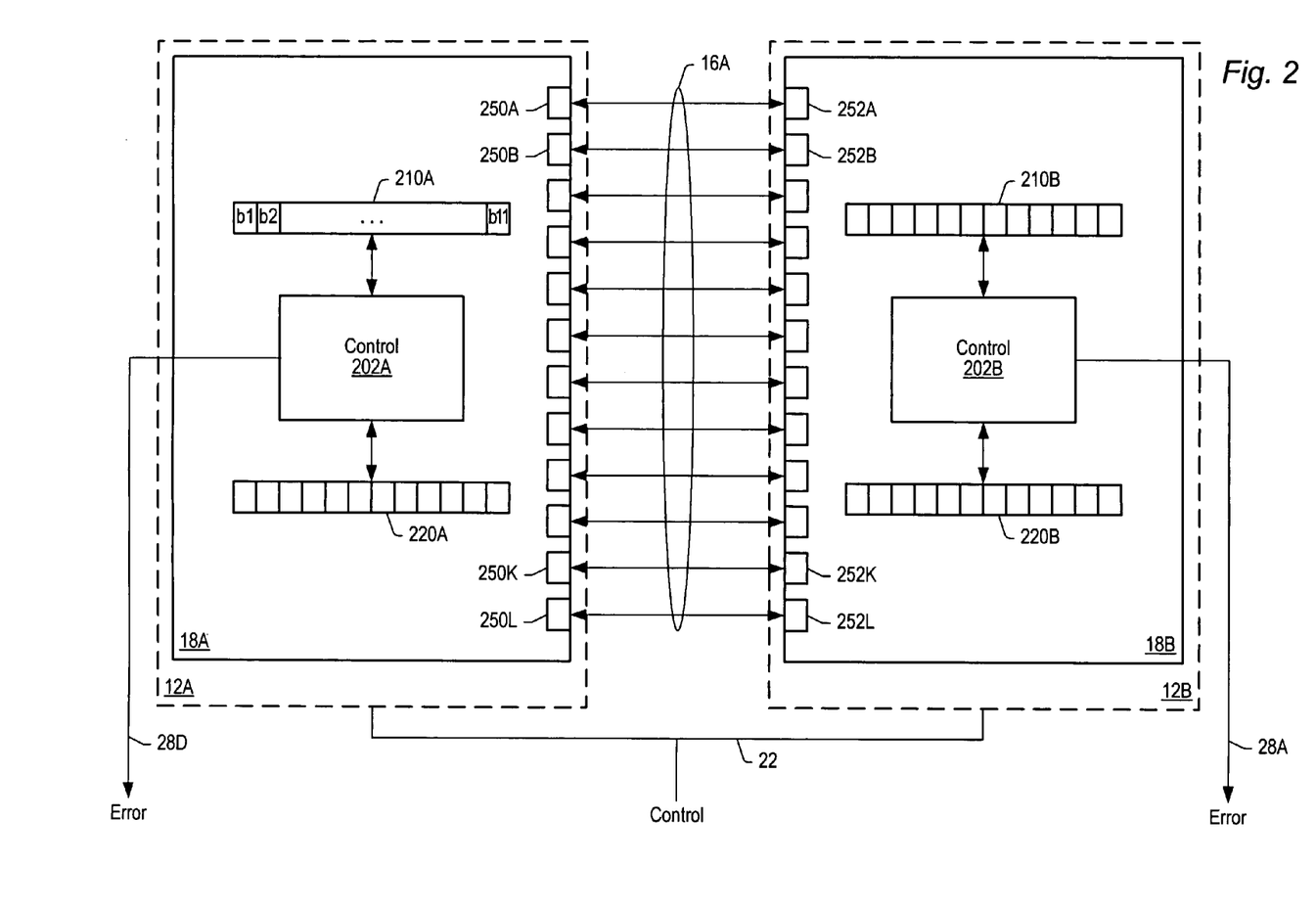
FIG. 2 illustrates one embodiment of a computer system.

Turning now to FIG. 2, one embodiment of a portion of system 10 is illustrated. FIG. 2 shows component 12A coupled to component 12B via link 16A. In the embodiment shown, link 16A includes twelve signal lines. Each component 12A and 12B includes circuitry, 250 and 252 respectively, configured to drive and receive signals upon the signal lines of link 16A. Each of components 12 include an IBIST circuit 18. Each of IBIST circuits 18A-18B include a control circuit 202, register 210 and register 220. Each of components 12 are also coupled to receive control signal 22. It is noted that the embodiment illustrated in FIG. 2 is intended to be exemplary only. Upon reading this description, those skilled in the art will recognize numerous alternative configurations are possible.

In the embodiment of FIG. 2, control circuit 202 may be configured to perform both test pattern generation and test pattern checking. Upon detecting a mismatch between a received pattern and expected pattern, control circuit 202 may convey an error indication 28. Registers 210 and 220 are each configured to store bit patterns for use by control circuit 202 in generating test patterns. Though not necessary, link 16A may include the same number of signal lines as there are bits in each register, 210 and 220. For example, in FIG. 2 link 16A includes twelve signal lines and each of registers 210 and 220 includes twelve bits b0-b11. In one embodiment, each bit of registers 210 and 220 corresponds to a signal line of link 16A and may supply a value for the corresponding line during testing. As will be described in more detail below, each test cycle, control circuit 202 may be configured to select a value from one of the registers (e.g., 210A or 220) for conveyance upon the corresponding signal line.

During testing, control signal 22 conveys indications to each of components 12 indicating a type of test to be performed. Further, control signal may also be configured to load registers 210 and 220 with particular values. In one embodiment, one or more of three types of tests may be performed: unidirectional, bi-directional with no turn around, and/or bi-directional with turnaround. While other types of tests are possible and are contemplated, these three types of tests will be used for purposes of discussion. During unidirectional testing, a test sequence comprises one component conveying test vectors to a second component where they are checked. During bi-directional testing, a test sequence includes both of at least two components conveying and checking test vectors.

During testing it is generally desirable to cover as many data transition cases as possible. For example, it may be desirable to cover all permutations of driver interaction between components which are driving a common signal line. As an example, referring to FIG. 2, it may be desirable to perform a test wherein a driver 250A drives a high value followed by driver 252A driving a low value. In this manner, if one driver is overdriving the other or is stuck at a particular value, the receiving component may detect this. Another test which may be desirable involves one driver 250A driving a particular value followed by the other driver 252A driving the same value. Such a test may be useful for characterizing the signals being driven by each component and may, for example, be useful in identifying any offsets between the drivers. Another useful test includes each driver driving different sequential combinations of value. For example, it may be desirable to test driver 250A as it drives a low value followed by a low value, low followed by high, high followed by low, and high followed by high. Further, it is generally desirable to test cases in which errors are more likely. For example, a minimal test sequence may test changes in value since such cases represent likely error cases. Additional test sequences may be chosen which are useful for testing electrical characteristics. Numerous such alternatives are possible and are contemplated.

Generally speaking, test pattern generators may involve relatively complex circuitry configured to provide for a wide variety of test vectors to test a variety of scenarios. However, in the embodiment described below, a fairly simple pattern generator is described which may nevertheless provide good test coverage. In this embodiment, a sixteen cycle sequence is utilized to generate test patterns. This sixteen cycle sequence may be repeated a number of times during the course of a particular test. In order to identify a suitable sequence, the observations described below may be made.

Assume a first component A is coupled to a second component B via a link. As noted above, it may be desirable to test the various combinations of sequences driven by a particular component driver. Assuming "0" represents a low value being driven and "1" represents a high value being driven, we may represent the various two value permutations being driven by component A as:

| | |
|---|---|
| A0A0 | A drives low followed by low |
| A0A1 | A drives low followed by high |
| A1A0 | A drives high followed by low |
| A1A1 | A drives high followed by high |

Similarly, the permutations of values driven by component B may be represented:

| | |
|---|---|
| B0B0 | B drives low followed by low |
| B0B1 | B drives low followed by high |
| B1B0 | B drives high followed by low |
| B1B1 | B drives high followed by high |

As already noted, testing the interactions between drivers may be desirable as well. One way to identify the various permutations of driver interactions between component A and component B using the above permutations involves comparing the last driven value by a first driver with a first driven value by a second driver. A graphical representation of such interactions is depicted below. In the following, each of items 1-8 represent a time period during which a particular driver is driving a combination of two values. For simplicity of discussion, time values in increments of one have been included. By lining up the last value driving by a particular driver with the first value driven by the following driver, the various permutations may be readily identified. Consequently, by choosing an appropriate ordering of the two value sequences which are driven, all driver interaction permutations may be tested.

| | | |
|---|---|---|
| 1. Time 0-1 | Driver A drives | A0A0 |
| 2. Time 2-3 | Driver B drives | B1B0 |
| 3. Time 4-5 | Driver A drives | A0A1 |
| 4. Time 6-7 | Driver B drives | B1B1 |
| 5. Time 8-9 | Driver A drives | A1A0 |
| 6. Time 10-11 | Driver B drives | B0B0 |
| 7. Time 12-13 | Driver A drives | A1A1 |
| 8. Time 14-15 | Driver B drives | B0B1 |

For example, items 1 and 2 illustrate that driver A drives 00 ("A0A0") followed by driver B driving 10 ("B1B0"). By lining up the last value driven by driver A with the first value driven by driver B, we see that in this particular ordering driver A drives a "0" followed by B driving a "1". By ordering each of the items above appropriately, all permutations of driver interaction maybe tested. In the particular ordering illustrated above, the following permutations are covered as indicated in the following table:

| Permutation | Items |
|---|---|
| A0 B0 | 5 -> 6 |
| A0 B1 | 1 -> 2 |
| A1 B0 | 7 -> 8 |
| A1 B1 | 3 -> 4 |
| B0 A0 | 2 -> 3 |
| B0 A1 | 6 -> 7 |
| B1 A0 | 8 -> 1 |
| B1 A1 | 4 -> 5 |

It is noted from the above, that the permutation B1 A0 is accomplished by repeating the sequence. In other words, during a first sixteen cycle sequence, the last value driven is the value "1" by driver B. By immediately repeating the sequence, the next value driven is the value "0" by driver A. It is further noted that orderings other than the above will also cover the various permutations. However, utilizing a single sixteen cycle sequence as described above, all driver interaction permutations and single driver two value permutations are tested. Using such a sixteen cycle sequence as a basis, an efficient method and mechanism for testing may be constructed.

Figure 3A:
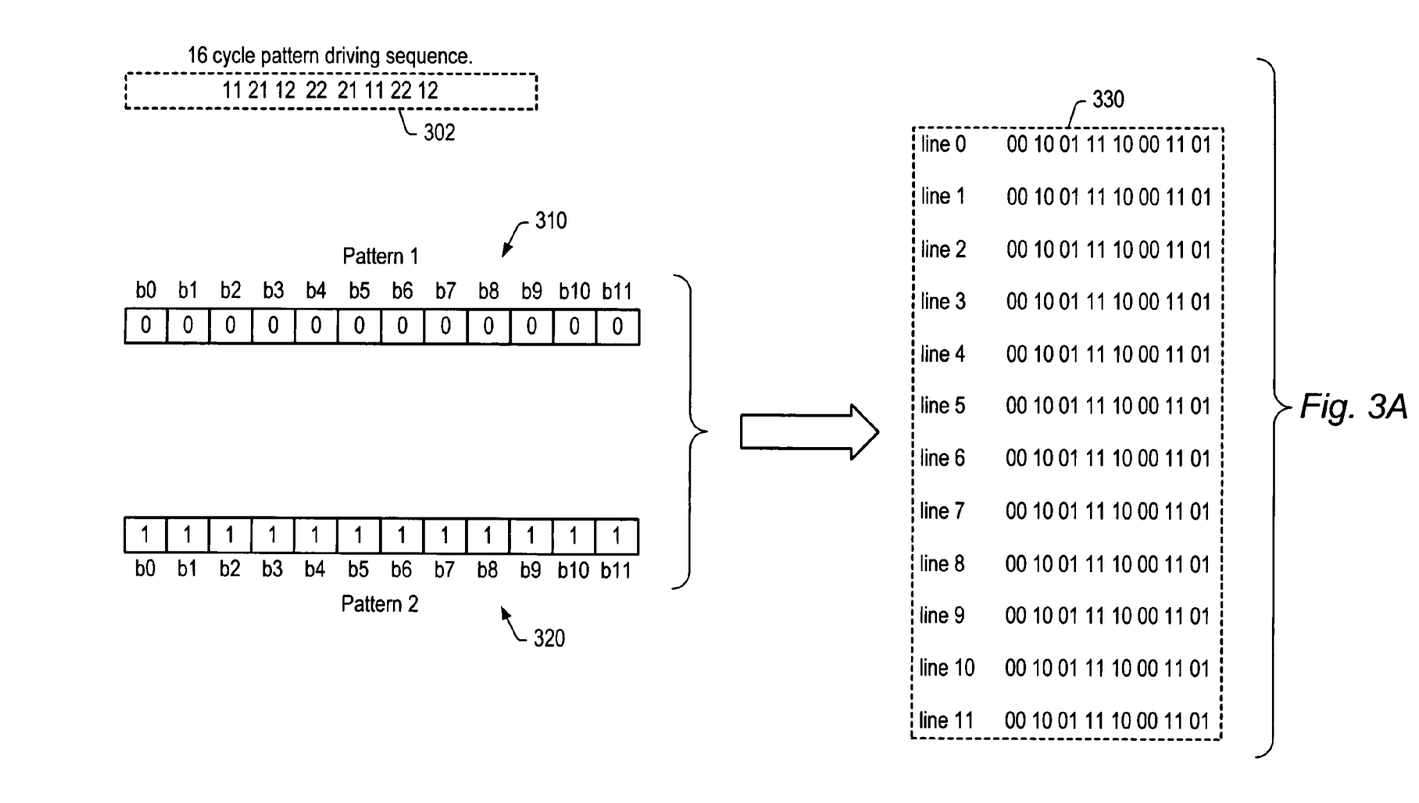
FIG. 3A illustrates one embodiment of the generation of a base test pattern.

Turning now to FIG. 3A, one example of such a method is illustrated. FIG. 3 shows two registers, 310 and 320, which may generally correspond to registers 210A and 220A of FIG. 2, respectively. In the embodiment shown, register 310 is configured to store a first pattern (Pattern 1) and register 320 is configured to store a second pattern (Pattern 2). Also illustrated is a sixteen cycle driving sequence 302 depicting which patterns, Pattern 1 ("1") 310 or Pattern 2 ("2") 320, supply a value on a given driving cycle. Therefore, the sequence 302 illustrates driving a value from Pattern 1 ("1") followed by "1", "2", "1", "1", "2", and so on. In the example shown, Pattern 1 310 is storing all zeroes and Pattern 2 320 is storing all ones. Consequently, using the driving pattern 302 with the registers 310-320 and values stored therein, results in a test pattern of "00 10 01 11 10 00 11 01". In one embodiment, this pattern 330 may be referred to as the "base" pattern. The inverse of the base pattern may be referred to as the "opposing" pattern.

In the embodiment shown, each register 310 and 320 has a same number of bits as there are signal lines in a corresponding link 330. As shown, each register includes twelve bits b0-b11 and link includes twelve lines line 0-line 11. Link 330 shows the test pattern which is driven on each of the corresponding link lines over the sixteen cycles. In this example, the pattern driven on each link line is the same. While the term "cycles" is used here, it is to be understood that a cycle does not necessarily refer to a single clock cycle. Rather, cycle in this context may simply refer to a driving period.

Figure 3B:
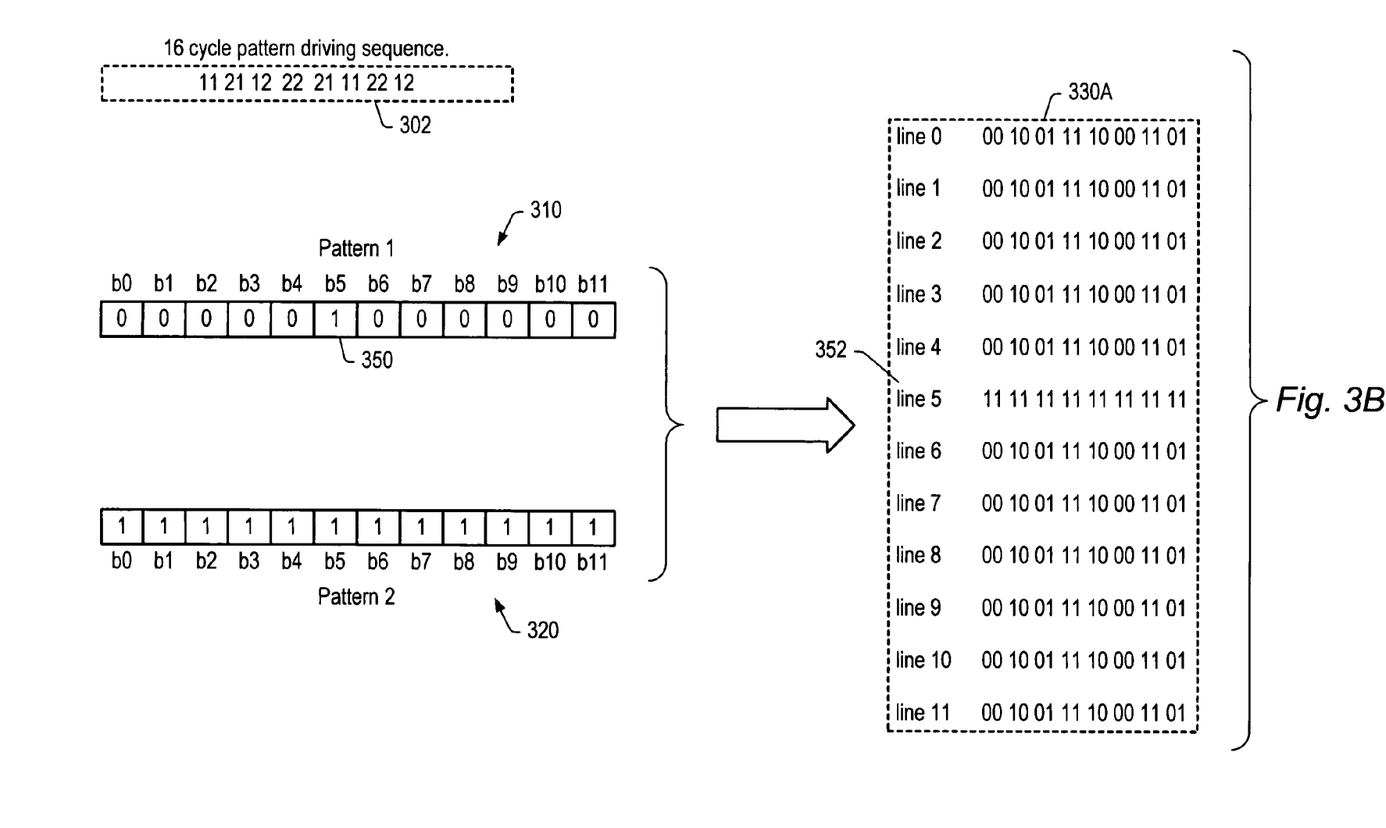
FIG. 3B illustrates generation of a test pattern with a held value.

FIG. 3B illustrates how different test patterns may be easily generated while using the same pattern driving sequence. FIG. 3B shows the same pattern sequence 302, and registers 310 and 320 as in FIG. 3A. Also illustrated is link 330A. However, in this example it is desired to hold a particular link line to a single value. By inverting bit b5 350 of register 310, line 5 352 of the link 330A is maintained high throughout the test. Other lines may be similarly held to high or low values by inverting a respective value of the corresponding register (310 or 320) bit. Consequently, the same pattern driving sequence (and ostensibly the same circuitry) may be used. Alternatively, a line may be held to a particular value by controlling the selection of values of Pattern 1 and Pattern 2 rather than inverting test pattern values. Holding a line to a particular value may be useful in testing cross-talk and the effects of simultaneous switching on a driver/receiver. For example, if all lines but one are held high, the low line may be pulled up by the others. Similarly, if all lines but one are held low, a pull-down effect may be detected.

Figure 3C:
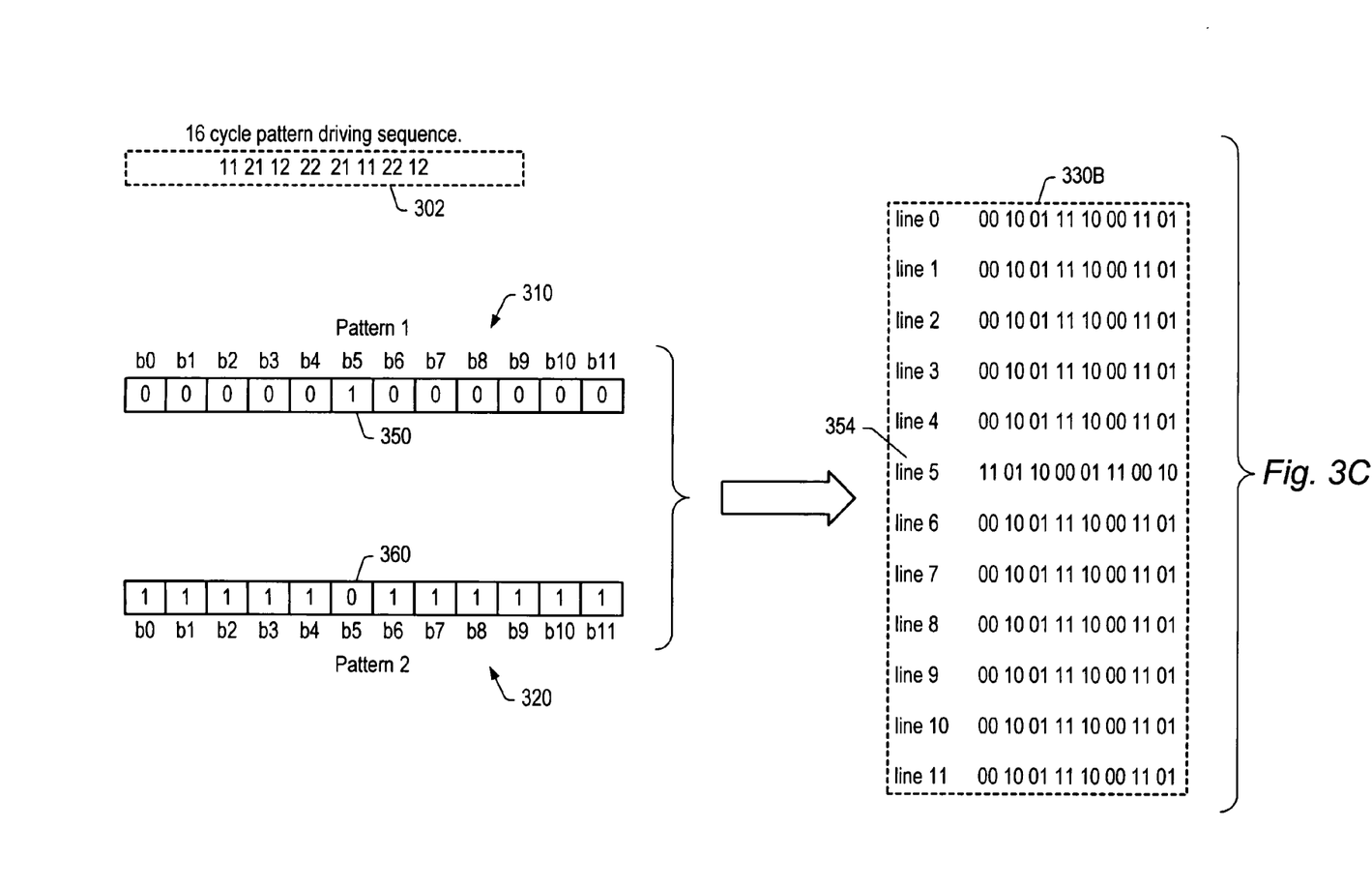
FIG. 3C illustrates generation of an opposing test pattern.

FIG. 3C demonstrates an example wherein an opposing test pattern may be easily generated. By selectively controlling the test patterns on individual link lines, tests concerning interactions (e.g., cross-capacitance or other interference) between the lines themselves may be conducted. In this example, both bit b5 350 of register 310 and bit b5 360 of register 320 are inverted. Using the same pattern driving sequence 302 as before, the corresponding link 330B line 354 now conveys the opposing test pattern. Alternatively, an opposing pattern may be generated by reversing the selection of values of Pattern 1 to Pattern 2, and vice-versa.

Figure 4:
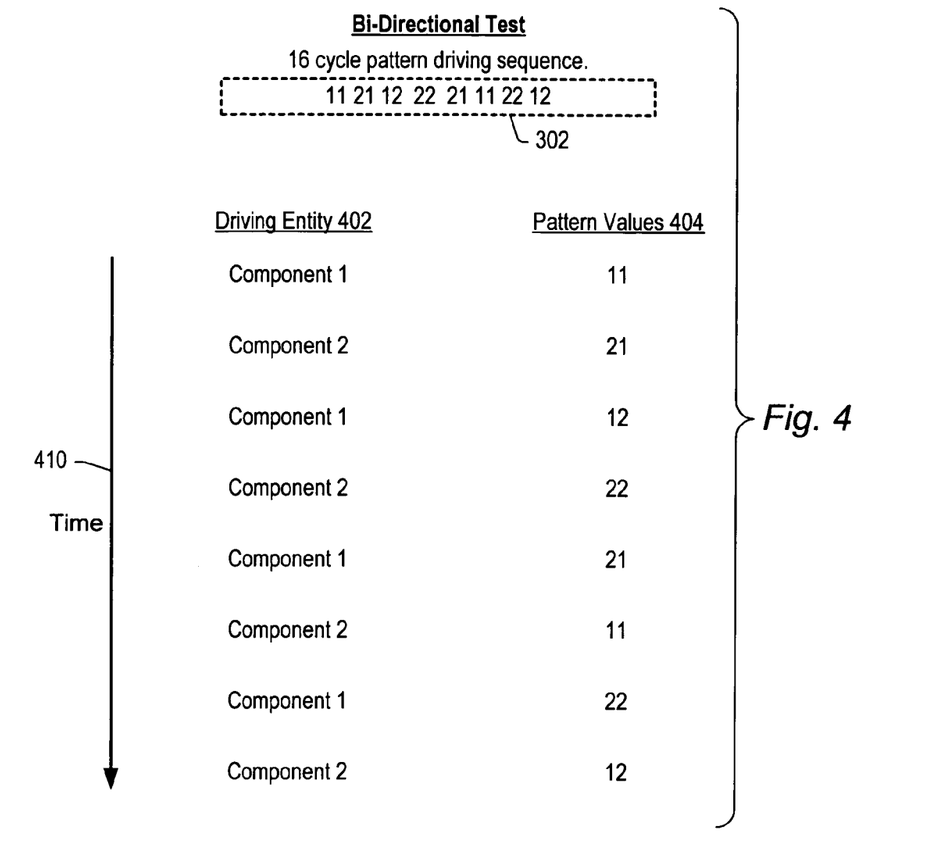
FIG. 4 illustrates one embodiment of a bi-directional test.

FIG. 4 illustrates one embodiment of a bi-directional test. In such a test, two components coupled to each other alternate driving particular values. In the example of FIG. 4, pattern driving sequence 302 is used. Similar to the discussion above, each component 402 is shown to drive pattern values 404 from either Pattern 1 "1" or Pattern 2 "2". Timeline 410 illustrates the sequence in which each component drives. Using the pattern driving sequence 302, component 1 drives values from "1" then "2". Next, component 2 drives values from "2" then "1". Following that, component 1 drives values from "2" then "1", and so on. Finally, at the end of the pattern driving sequence, component 2 drives "1" followed by "2".

Figure 5:
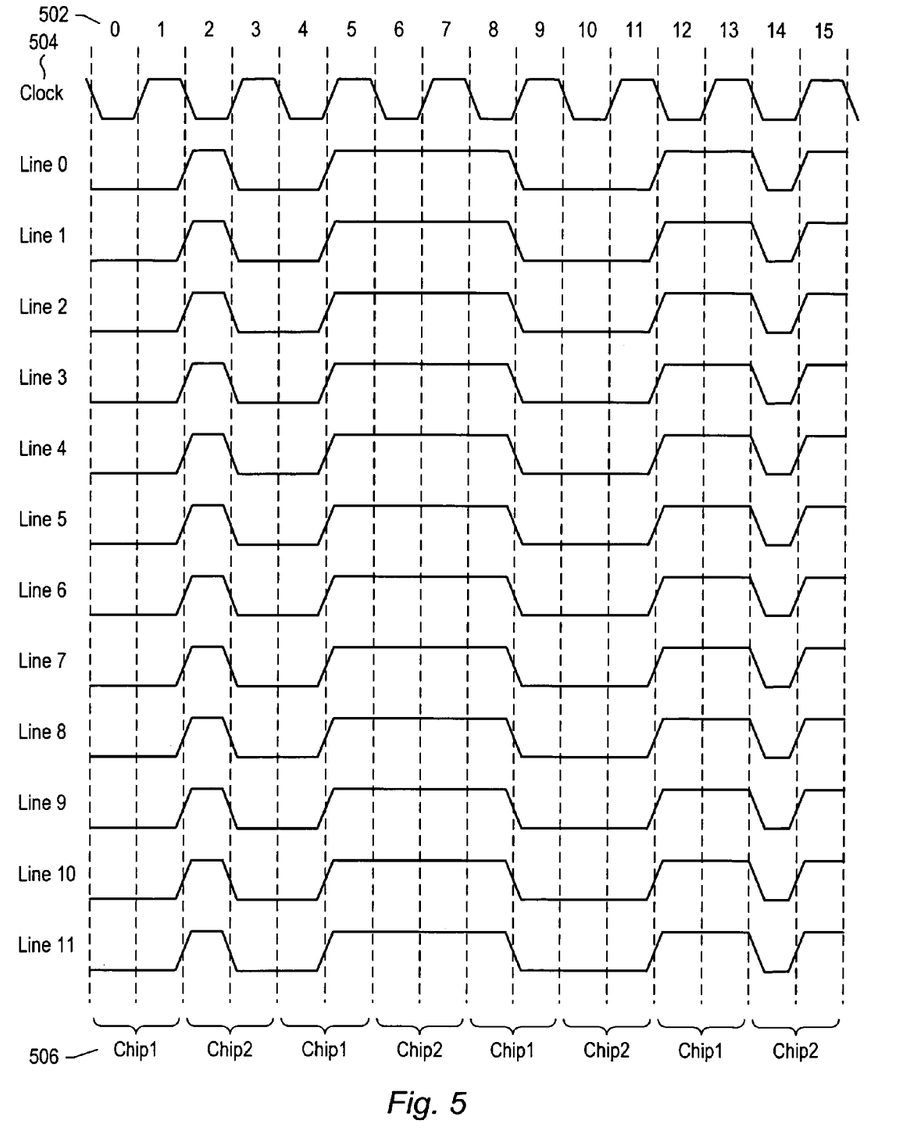
FIG. 5 illustrates one embodiment of a bi-directional test.

FIG. 5 illustrates a bi-directional test based on the above-mentioned pattern 302. FIG. 5 shows a timing diagram including a clock signal 504, cycle 502, and an indication 506 as to which component is driving during a corresponding cycle. It is noted that clock signal 504 may operate at different frequencies in relation to the other signals. For example, in an alternative embodiment, clock signal 504 may operate at twice the frequency of that shown in FIG. 5.

In the example shown, sixteen cycles are illustrated which correspond to the sixteen cycle pattern driving sequence 302 previously discussed. During cycles 0-1 Chip 1 drives values "0" and "0", respectively. During cycles 2-3, Chip 2 drives values "1" and "0", respectively. Each chip alternates driving during the sixteen cycle sequence. Subsequently, the sequence may be repeated. In one embodiment, each component (or "Chip") utilizes the same values/patterns as shown in registers 310 and 320 of FIG. 3A. These values may be stored locally within each component, or may could be stored in a common location which is accessed by each component. As described above, particular lines may be selected to convey an opposing pattern or to be held to a particular value. In any event, a single sixteen cycle pattern driving sequence may be used for all such tests. In one embodiment, a component may be configured to loop-back test values for purposes of self-test.

Figure 6:
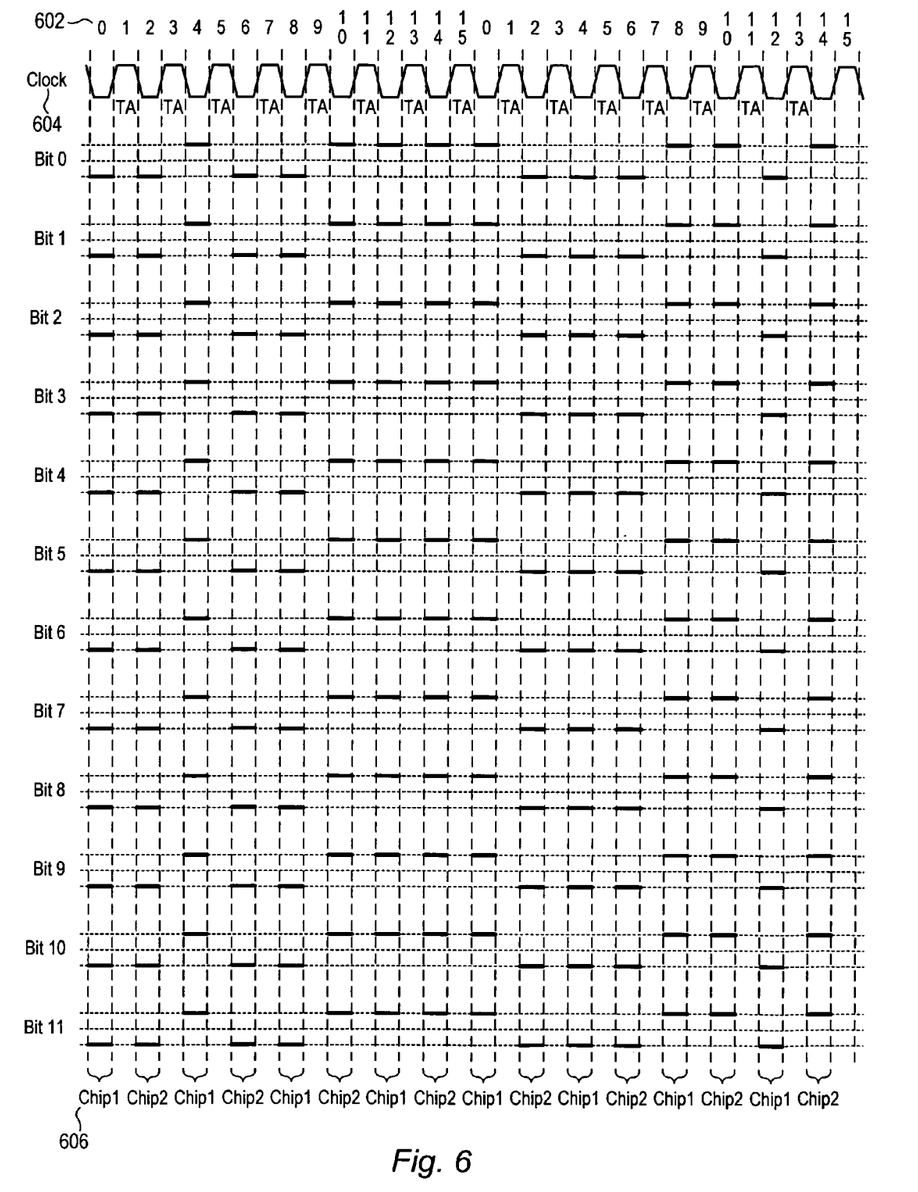
FIG. 6 illustrates one embodiment of a bi-directional test with turn-around.

FIG. 6 illustrates another bi-directional test. In this example, turn-around cycles (TA) are utilized between changes in drivers on the bus. Turn-around cycles may be necessary in some cases to allow one driver to release a transmission line prior to another driver driving upon the line and may generally be used to prevent bus contention. FIG. 6 illustrates a timing diagram including a clock signal 604, cycles 602, and a chip 606 which is driving during a given cycle.

Figure 7:
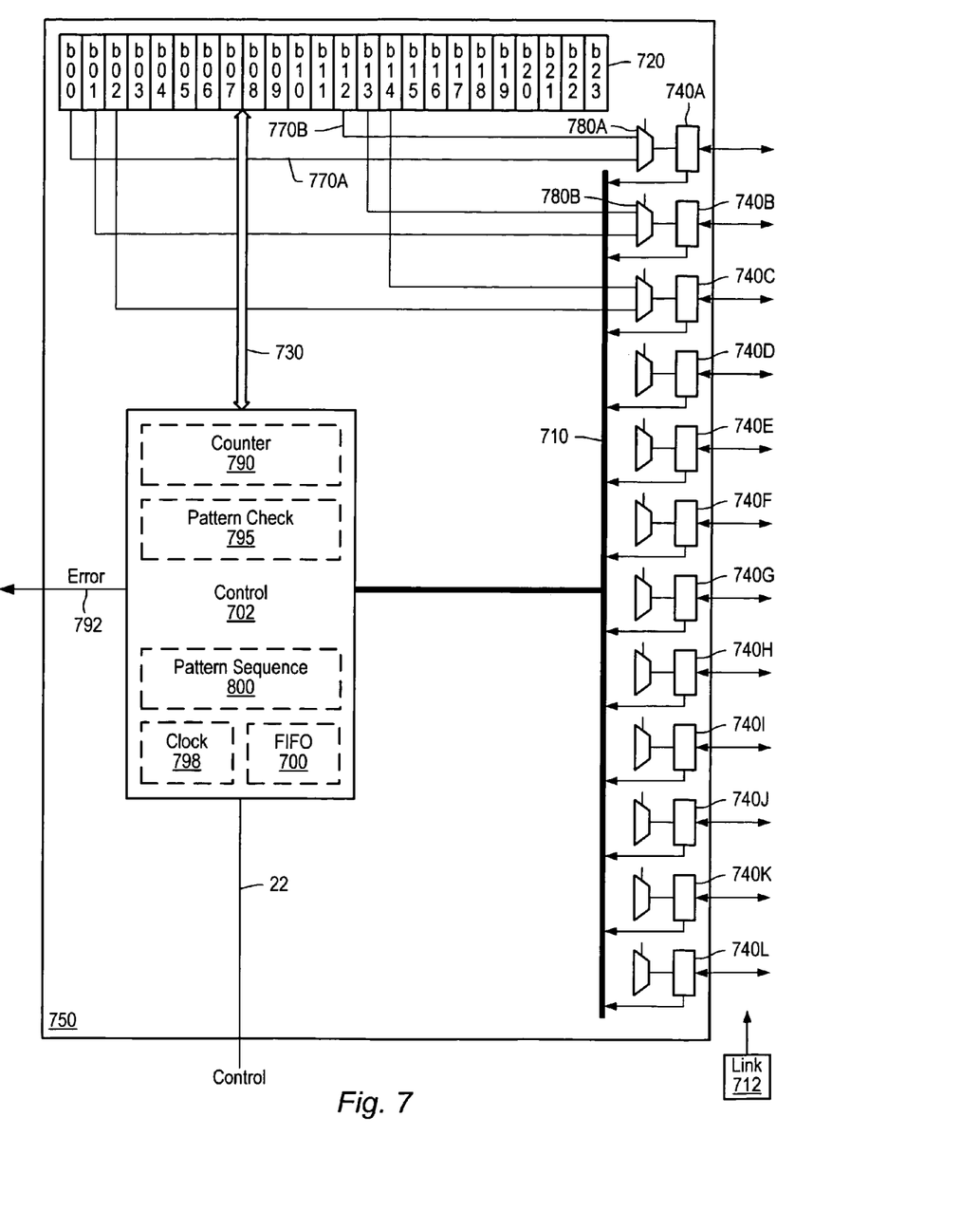
FIG. 7 illustrates one embodiment of a component and control circuitry.

Turning now to FIG. 7, one embodiment of a component 750 is illustrated. In the embodiment shown, component 750 includes driver/receivers 740A-740L configured to both drive and receive data values. Driver/receivers 740 may include one or more registers and circuitry as appropriate. Also included in a control circuit 702 coupled to a pattern register 720 via bus 730. Control unit 702 is coupled to receive control signal 22. Each of drivers 740 are configured to receive a value from an associated multiplexor. For example, driver 740A is coupled to receive a value from multiplexor 780A. Each of the multiplexors is coupled to receive two values from the register 720 and is configured to convey a received value to the driver in response to a control signal received from control unit 702. Control unit 702 is configured to read and/or write values into register 720 via bus 730. Values received by receivers 740 via link 712 may be conveyed to control unit 702 via bus 710. In an alternative embodiment, driver/receivers 740 may include circuitry to perform error checking locally. Error indications may then be stored by a driver/receiver 740 locally and later retrieved by control circuit 702, a service processor, or otherwise.

In FIG. 7, register 720 includes 24 bits (b00-b23) and generally corresponds to the registers 310 and 320 previously discussed. In one embodiment, a first portion of register 720 (e.g., b0-b11) is configured to hold a first pattern, and a second portion of the register 720 (e.g., b12-b23) is configured to hold a second pattern. In such an embodiment, Corresponding bits of each pattern are coupled to one of the multiplexors. The first bits of each pattern (bit b00 and bit12) are coupled to multiplexor 780A for driving via driver 740A. Similarly, the second bits of each pattern (bit 01 and bit13) are coupled to multiplexor 780B for driving via driver 740B, and so on. It is noted that in alternative embodiments, one or more driver/receivers 740 may share a given register 720 value rather than having separate register values. For example, where it is believed that cross-talk between particular lines is not a problem, such lines may share a register value.

In an embodiment wherein more than one type of test is possible, control unit 702 receives a signal 22 indicating a type of test to be performed. For example, signal 22 may indicate a bi-directional test with no turn-around is to be performed. Further, the signal 22 may indicate the component 750 is configured to drive values of a test pattern on the first two cycles, receive values on the following two cycle, drive values on the following two cycles, and so on. In response to receiving an indication via signal 22, control unit 702 may load register 720 with appropriate values for use in generating test patterns as previously discussed. As testing progresses, control unit 702 may either select values from register 720 for conveyance via drivers 740 or receive values via bus 710.

Control unit 702 may further include a clock generator 798 and counter 790 which is configured to operate at a frequency which is equal to or a multiple of the clock. Control unit 702 may also include a pattern sequence unit 800. Pattern sequence unit may comprise circuitry such as a state machine configured to generate a test pattern sequence as described above, or may include a register wherein values corresponding to a test pattern sequence are stored. Such a counter may be used for selecting values for conveyance via the multiplexors at a variety of frequencies. In an alternative embodiment, a clock signal may be received from an external source. Control unit 702 may also include a pattern check unit 795 which is configured to check received values against expected values. In one embodiment, each component under test utilizes the same values in a register such as register 720. Consequently, in a bi-directional test each component will include both the values which it is to drive and the values which it is to expect to receive. In the event pattern check unit 795 detects a received value does not match what is expected, an error signal 792 maybe conveyed. Control unit 702 may also include a FIFO 700 configured to store received values. FIFO 700 may be utilized, for example, to accommodate a rate mismatch between two components which are under test, to synchronize testing across asynchronous boundaries, or otherwise.

In alternative embodiments, groups of link lines may be tested at different frequencies simultaneously. For example, control circuit 702 may include multiple counters similar to counter 790. Each of the counters may then be associated with a different sub-group of the driver/receivers 740. By using different counts/counters different frequencies may be obtained for each of the sub-groups. In one embodiment, multiple control circuits similar to control circuit 702 may be included with each of the control circuits being configured to control a sub-group of the driver/receivers 740.

Numerous variations and modifications will become apparent to those skilled in the art once the above disclosure is fully appreciated. It is intended that the following claims be interpreted to embrace all such variations and modifications.

What is claimed is:

1. A method for testing comprising:
   storing a first value of a first pattern in a register;
   storing a second value of a second pattern in the register;
   receiving a clock signal;
   selecting either said first value or said second value for inclusion in a test pattern for conveyance via a link in response to said clock signal;
   wherein determining whether to select either said first value or said second value on a given clock cycle is determined according to a predetermined test pattern sequence; and
   wherein said register comprises N bits, said first pattern comprises N/2 bits, said second pattern comprises N/2 bits, and said link comprises N/2 signal lines, and wherein each signal line corresponds to one bit of each of said first pattern and said second pattern.

2. The method as recited in claim 1, wherein said test pattern sequence comprises a plurality of indications, each of said indications indicating either said first value or said second value.

3. The method as recited in claim 2, wherein said first value is stored in a first register location, and said second value is stored in a second register location, and wherein both said first and second register locations correspond to a same link signal line.

4. The method as recited in claim 3, further comprising driving values of said test pattern from a first component to a second component.

5. The method as recited in claim 4, wherein each of said first component and said second component alternate driving values of said test pattern during a sixteen test cycle sequence.

6. The method as recited in claim 5, wherein said alternate driving of values by said first component and said second component is separated by one or more turn-around cycles.

7. A system comprising:
   a first component;
   a second component; and
   a link coupling said first component to said second component;
   wherein said first component is configured to:
     determine whether to select either a first stored value of a first pattern in a register or a second stored value of a second pattern in a register for inclusion in a test pattern on a given clock cycle, wherein said determination is based upon a predetermined test pattern sequence;
   wherein said register comprises N bits, said first pattern comprises N/2 bits, said second pattern comprises N/2 bits, and said link comprises N/2 signal lines, and wherein each signal line corresponds to one bit of each of said first pattern and said second pattern.

8. The system as recited in claim 7, wherein said predetermined test pattern sequence comprises a sequence of sixteen indications, each of said indications indicating either said first value or said second value.

9. The system as recited in claim 8, wherein said link comprises a signal line, and wherein said first value is stored in a first register location, and said second value is stored in a second register location, and wherein both said first and second register locations correspond to a same link signal line.

10. The system as recited in claim 9, wherein said first component is configured to drive values of said test pattern to said second component.

11. The system as recited in claim 10, wherein each of said first component and said second component alternate driving values of said test pattern during a sixteen indication test cycle sequence.

12. The system as recited in claim 10, wherein each of said first component and said second component alternate driving values of said test pattern during a sixteen test cycle sequence, wherein each of said components drives two consecutive values in turn.

13. A component comprising:
- a plurality of drivers, each of said drivers coupled to a separate signal line of a plurality of signal lines of a link;
- a register configured to store a first bit pattern and a second bit pattern, wherein each bit of said first bit pattern and said second bit pattern corresponds to a signal line of said link;
- a test pattern sequence unit, wherein said unit is configured to indicate a predetermined sequence in which values are to be selected from either said first bit pattern or said second bit pattern; and
- control circuitry configured to generate a test pattern, wherein on a given test cycle said circuitry is configured to select a value from either said first bit pattern or said second bit pattern in response to detecting an indication in said test pattern sequence which indicates one of said first bit pattern and said second bit pattern is to be accessed;
- wherein said register comprises N bits, said first pattern comprises N/2 bits, said second pattern comprises N/2 bits, and said link comprises N/2 signal lines, and wherein each signal line corresponds to one bit of each of said first pattern and said second pattern.

14. The component as recited in claim 13, wherein said predetermined test pattern sequence comprises a plurality of indications, each of said indications indicating either said first value or said second value.

15. The component as recited in claim 14, wherein each test cycle said control circuitry iterates through said test pattern sequence in order to ascertain a bit pattern indication for each test cycle.

16. The component as recited in claim 15, wherein said component is configured to drive values of said test pattern via said link.

17. The component as recited in claim 16, wherein during a sixteen test cycle sequence, said component is configured to alternate between driving two sequential values of said test pattern and receiving two values of said test pattern.

18. The component as recited in claim 13, further comprising a plurality of receivers coupled to said link, and wherein said component includes pattern checking circuitry configured to compare values received via said link to expected values.

19. The component as recited in claim 13, wherein each signal line is coupled to receive a value from a multiplexor, wherein each multiplexor is coupled to one bit of said first pattern and one bit of said second pattern, and wherein said control circuitry is configured to control each multiplexor to convey from each multiplexor a bit from either said first pattern or said second pattern.

* * * * *